US005187315A

United States Patent [19]

Muramatsu et al.

[11] Patent Number: 5,187,315

[45] Date of Patent: Feb. 16, 1993

[54] MUSICAL TONE CENTRAL PARAMETER CONTROLLER FOR A MUSICAL INSTRUMENT

[75] Inventors: Shigeru Muramatsu; Keisuke Watanabe; Junichi Mishima, all of Hamamatsu, Japan

[73] Assignee: Yamaha Corporation, Hamamatsu, Japan

[21] Appl. No.: 495,376

[22] Filed: Mar. 19, 1990

[30] Foreign Application Priority Data

Mar. 20, 1989 [JP] Japan .................................. 1-68822
May 2, 1989 [JP] Japan .................................. 1-113369

[51] Int. Cl.[5] ........................ G10H 1/34; H01L 41/08; H01C 10/10

[52] U.S. Cl. ........................................ 84/688; 84/687; 84/DIG. 7; 338/99

[58] Field of Search .................. 84/DIG. 7, 688, 720, 84/678, 687, DIG. 8, 441, 442, 433, 439; 338/99

[56] References Cited

U.S. PATENT DOCUMENTS 4,580,478 4/1986 Brosh et al. .
4,615,252 10/1986 Yamauchi et al. .
4,838,139 6/1989 Fiori, Jr. .
4,852,443 8/1989 Duncan et al. ............... 84/DIG. 12

FOREIGN PATENT DOCUMENTS 54-20990 7/1979 Japan .
58-42890 3/1983 Japan .

*Primary Examiner*—William M. Shoop, Jr.
*Assistant Examiner*—Helen Kim
*Attorney, Agent, or Firm*—Spensley, Horn Jubas & Lubitz

[57] ABSTRACT

In construction of a keyboard apparatus in which a plurality of keys are swingably mounted to a fixed key support and change in electric inductance is induced in response to every key operation for adjustment of musical tone control parameters, the change in inductance by an inductance change inducer is detected by at least one planar coil pattern which is arranged such that its mating surface area with the an inductance change inducer should change in correspondence to the key stroke of the key at key operation. Thanks to use of the change in the mating surface area in detection, a linear relationship is obtained between the key stroke and the detection output, which well avoids inter-key variation in detection output for uniform generation of musical tones from different keys.

14 Claims, 17 Drawing Sheets

MUSICAL TONE CENTRAL PARAMETER CONTROLLER FOR A MUSICAL INSTRUMENT

BACKGROUND OF THE INVENTION

The present invention relates to a keyboard apparatus, and more particularly relates to an improvement in tone generation on a keyboard apparatus used for musical instruments such as electronic organs, electronic pianos and portable keyboard musical instruments in which a plurality of keys are swingably mounted to a fixed key support and a change in electric inductance is induced in response to every key operation in order to control musical tone control parameters.

Tone generation of an electronic musical instrument is conventionally controlled in response to key operation by means of a key switch attached to each key on a key support. Such a primitive way of tone generation control is too simple in characteristics to reflect player's emotion with complete fidelity. In an effort to meet with demand for richer reproduction of player's emotion during performance, the art of touch response was developed. In the case of this system, the keyboard apparatus has a function to adjust its tone generation in correspondence to finger pressure at key operation. More specifically, the tone volume, the tonal pitch and the tone colour of a tone to be generated are controlled in accordance with finger motion of the player at the beginning of the key operation and during the subsequent period of tone decay.

One example of such a touch response system is proposed in Japanese Utility Model Application Laid-Open Sho. 58-42890 in which an electrically conductive plate is attached to each key for causing a change in electric inductance and a coil is attached to a key support for detecting the change in inductance. At every key operation, the gap between the conductive plate and the coil varies to cause a change in inductance and the change is issued from the system in the form of a detection output.

In the case of this system the gap between the conductive plate and the coil varies at every key operation but without any change in the mating surface area between the two counterparts. With this system mechanism, there exists a parabolic relationship between the magnitude of the detection output and the extent of movement of the key (hereinafter referred to as "key stroke"). As a consequence, uniformity in detection outputs for a number of keys is greatly swayed by an inevitable structural error of the keys which is resulted from error in an interval between adjacent keys, in position of keys, in attachment of the conductive plate and/or the coil to each key and in other production factors. Presence of such inter-key variation of the detection outputs poses subtle, malign influence on tone generation by the system.

In the systems disclosed in Japanese Utility Model Application Laid open Sho. 60-125695 (U.S. Pat. No. 4,615,252) and Japanese Utility Model Publication Sho. 54-20990, a key operation signal and an after-control signal are generated separately. Separate generation of the two different signals, however, inevitably necessitates use of a complicated circuit construction. In addition, such an after-control signal cannot be obtained for an individual key. Provision of separate after-control signals for separate keys necessitates use of a further complicated circuit construction.

SUMMARY OF THE INVENTION

It is the object of the present invention to suppress interkey variation of detection outputs by a touch response system, thereby enabling sophisticated tone generation.

In accordance with the basic aspect of the present invention, at least one planar coil pattern is attached to a key or key support facing an inductance change inducing means for detection of the inductance change and the mating surface area between the coil pattern and the change inducing means is changed in correspondence to the key stroke of a key operated.

DESCRIPTION OF THE PREFERRED EMBODIMENTS

Figure 1:
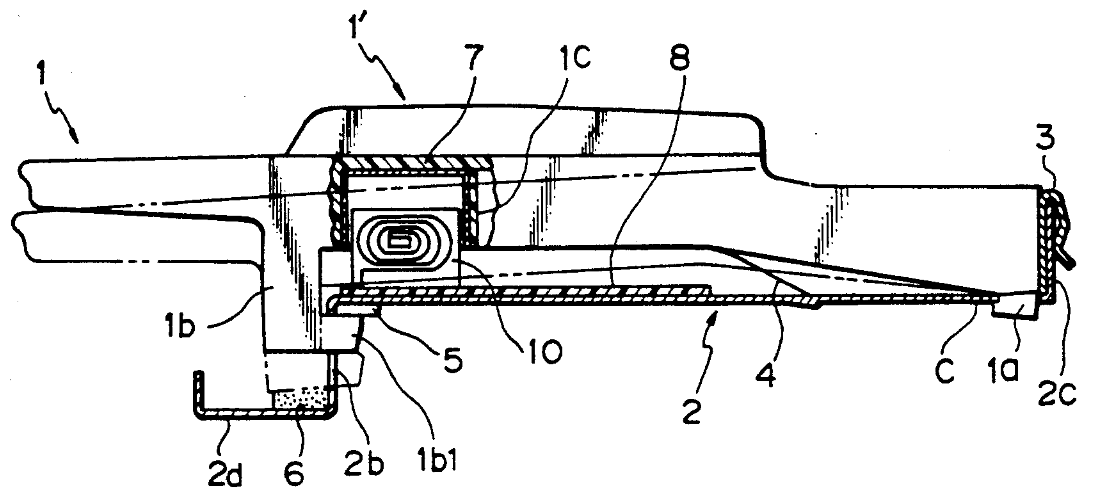
FIG. 1 is a side view, partly in section, of the first embodiment of the keyboard apparatus in accordance with the present invention.
Figure 3:
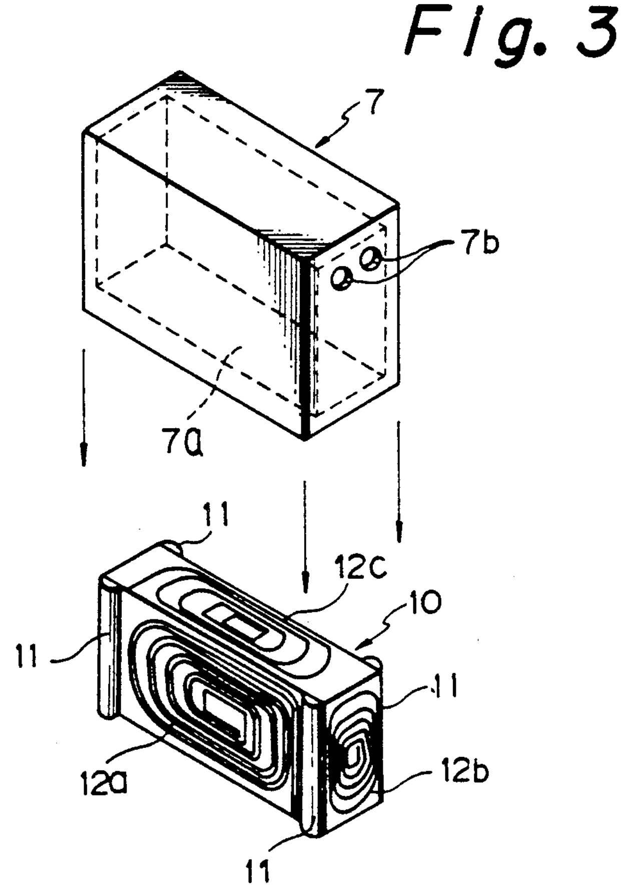
FIG. 3 is a perspective view of the key guide cap and the key guide block used for the apparatus shown in FIG. 1.
Figure 2:
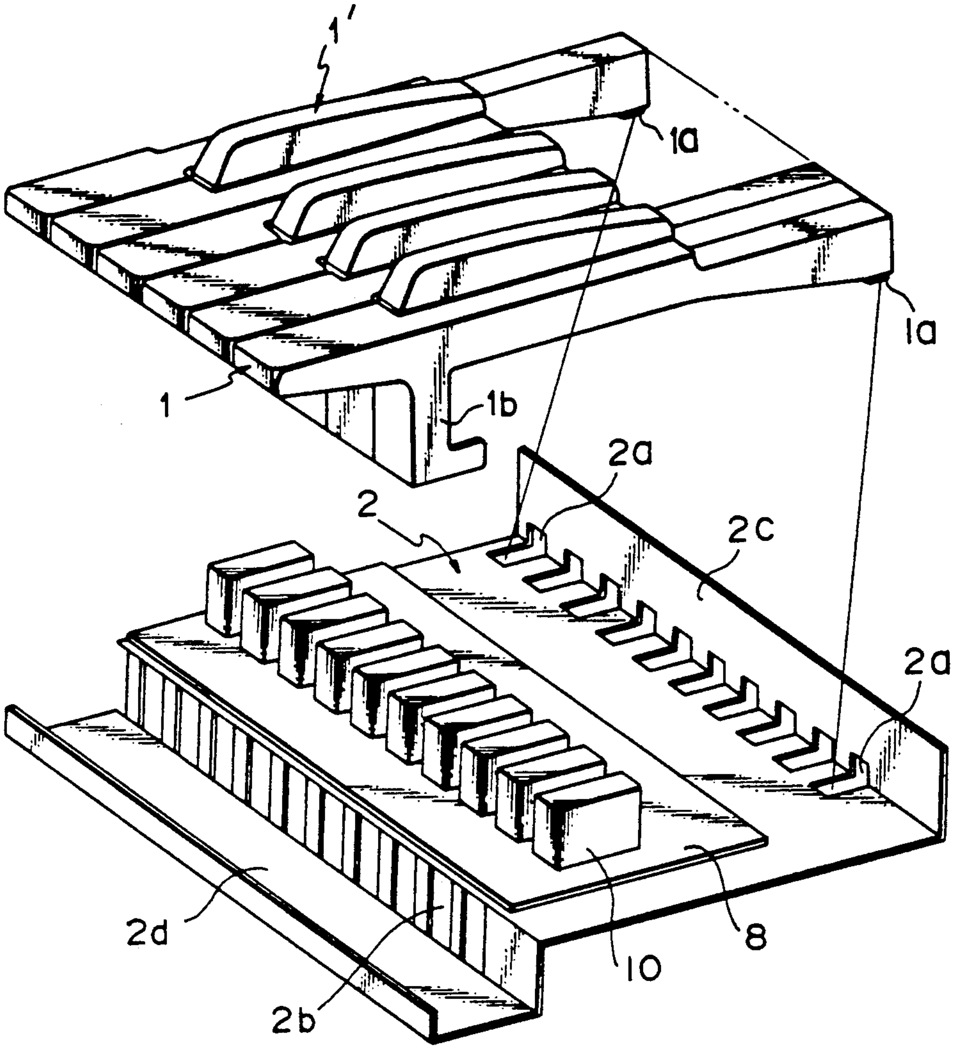
FIG. 2 is a perspective view of the keyboard apparatus in a disassembled state.

The first embodiment of the keyboard apparatus in accordance with the present invention is shown in FIGS. 1 to 3 in which a key 1 (or 1') made of synthetic resin is provided with a rear hook 1*a* projecting downwards, an L-shaped stopper 1*b* near its front end and a cavitious holder 1*c* located on the rear side of the stopper 1*b*. The holder 1*c* is open downwards.

A frame 2 acting as the key support is made of metal and provided with front and rear cutouts 2*b*, 2*a*. Each front cutout 2*b* is in meshing engagement with the front stopper 1*b* of each key 1 whereas each rear cutout 2*a* is in meshing engagement with the rear hook 1*a*. A clip-shaped leaf spring 3 is used to clamp a rear stand 2*c* of the frame 2 so that the key 1 is mounted to the frame 1 in an arrangement swingable about a pivot C located near the rear end of the frame 2.

A curved leaf spring 4 is interposed between the key 1 and the frame 2 to urge the front end of the key 1 to move upwards. The uppermost position of the key 1 is defined via contact of a bent section 1*b*1 of the stopper 1*b* with an upper stopper 5 attached to the lower face of the frame 2. When operated, the front end of the key 1 moves downwards. The lowermost position of the key 1 is defined via contact of the lower face of the stopper 1*b* with a lower stopper 6 attached to the upper face of a lower stem 2*d* formed near the front cutout 2*b*. Thus, the key stroke is defined by the upper and lower stoppers 5, 6.

A key guide cap 7 such as shown in FIG. 3 is force inserted into the holder 1*c* of each key 1. The guide cap 7 has a box type configuration made of magnetic metal such as Fe and Ni or non-magnetic metal such as Al. In the case of the example shown in FIG. 3, the guide cap 7 is open downwards and provided with side air vents 7*b*. This key guide cap 7 acts as a key guide and as the inductance change inducing means of the present invention.

A print circuit board 8 including necessary circuits is attached to the top face of the frame 2 and, as best seen in FIG. 2, a number of guide blocks 10, one for each key 1, are juxtaposed on the print circuit board 8. Back to FIG. 3, each guide block 10 has a box type configuration made of an insulating material such as synthetic resin and provided, on each side face parallel to the longitudinal direction of the associated key, with a pair of guide rails 11 extending in the vertical direction at the front and read ends of the face.

When the key 1 is unoperated, only the upper section of the guide block 10 is received in the guide cap 7 as shown in FIG. 1. When the key 1 is operated, the side faces of the cap 7 are placed in vertical sliding contact with the guide rails 11 on the side faces of the guide block 10.

Slight gaps are left between the front inner face of the guide cap 7 and the mating front face of the guide block 10 as well as between the rear inner face of the guide cap 7 and the mating rear face of the guide block 10. Thanks to presence of such gaps, there is no interference between the guide cap 7 and the guide block 10 when the key 1 swings from the solid line position to the dotted line position in FIG. 1 at key operation.

As best seen in FIG. 3, the guide block 10 is provided with three planar coil patterns 12*a* to 12*c* formed by printing. More specifically, the first coil patterns 12*a* are located on both side faces, the second coil pattern 12*b* on the front and rear faces and the third coil pattern 12*c* on the top face of the guide block 10, respectively. The planar coil patterns 12*a* to 12*c* are connected to an oscillation circuit incorporated in the above-described print circuit board 8 so that a change in inductance should cause a corresponding change in oscillating frequency, thereby adjusting musical tone control parameters as later described in more detail. These three planar coil patterns 12*a* to 12*c* act as a key guide and as the inductance detecting means.

As the guide block 10 is inserted into the guide cap 7, the coil patterns 12*a* to 12*c* on the guide block 10 mate the respective inside faces of the guide cap 7. Apparently key operation changes the mating surface area or the gap between each coil pattern on the guide block 10 and an associated inner face of the guide cap 7. Since the guide cap 7 is made of metal, such change in the mating surface area of gap causes a change in the permeability of the magnetic field acting on each coil pattern in the case of Fe or generates eddy currents in the case of Al. As a result, the inductance of each coil pattern changes accordingly.

In the case of the coil patterns 12*a* formed on both side faces of the guide block 10, only the mating surface area changes in a substantially linear mode without any substantial change in gap and, as a consequence, a substantially linear relationship is established between the key stroke and change in inductance. Presence of such a substantially linear relationship minimizes malign influence by possible errors in construction and operation of the associated key 1. In other words, inter-key variation in detection output can be well suppressed in the case of the present invention.

Figure 4:
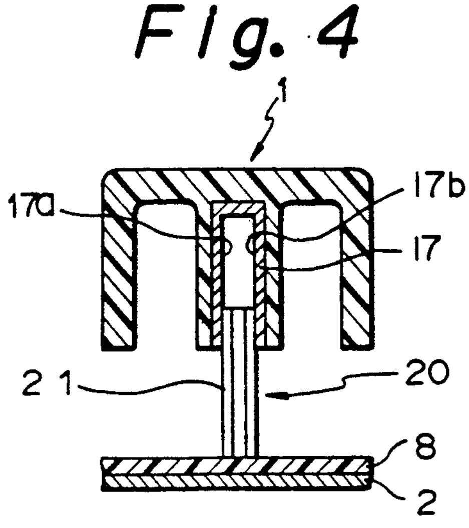
FIG. 4 is a transverse sectional view of the main part of the second embodiment of the keyboard apparatus in accordance with the present invention.
Figure 5:
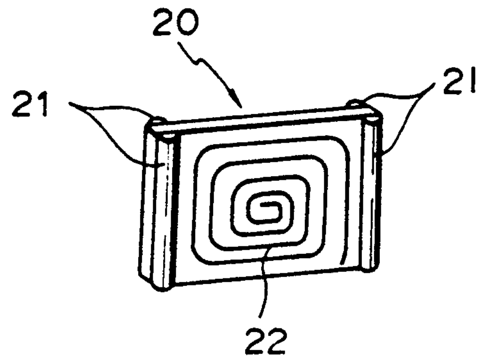
FIG. 5 is a perspective view of the key guide plate used for the apparatus shown in FIG. 4.

The second embodiment of the keyboard apparatus in accordance with the present invention is shown in FIGS. 4 and 5. In the case of this embodiment, the inductance change detecting means is given in the form of a key guide plate 20 made of the same material as that for the print circuit board 8 and having a thickness substantially the same as that of the print circuit board 8. The guide plate 20 is mounted to the print circuit board 8 on the frame 2 whilst extending in the longitudinal direction of the key 1. As shown in FIG. 5, the guide plate 20 is provided with coil patterns 22 formed on its side faces and a pair of vertical guide rails 21 formed on its both ends. A U-shaped guide channel 17 (FIG. 4) is force inserted into the guide holder 1*c* of the key 1 so that the guide plate 20 should be received in a gap between its opposite inner faces 17*a* and 17*b* at key operation. In the case of this embodiment, only the mating surface area changes without any change in gap at key operation.

Figure 6:
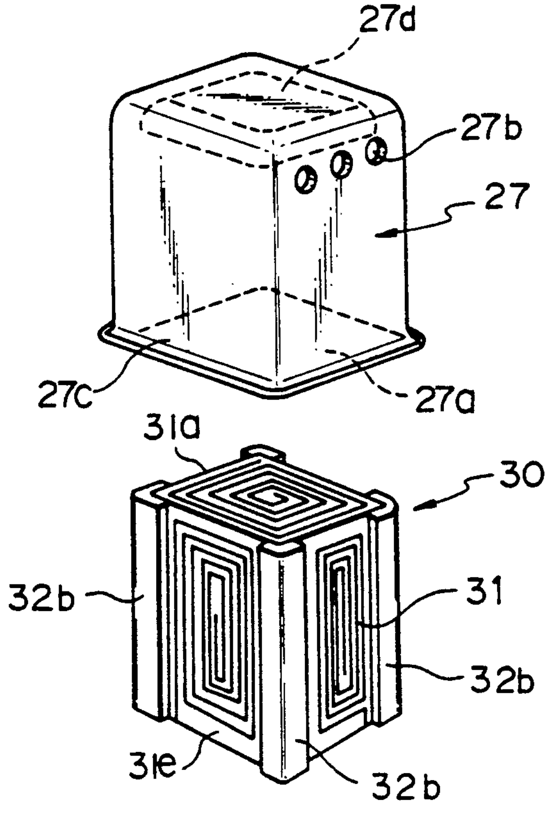
FIG. 6 is a perspective view of a guide cap and a guide block used for the third embodiment of the apparatus in accordance with the present invention.

The third embodiment of the keyboard apparatus in accordance with the present invention is shown in FIGS. 6 to 13, in which the construction of the key guide block and guide cap are somewhat modified. Such key guide cap 27 and key guide block 30 are shown in FIG. 6.

The guide cap 27, acting as the inductance change inducing means, has a boxy type metallic configuration with a bottom opening 27*a* and side air vents 27*b*. For easier insertion of the key block 30, an outer flange 27*c* is formed at the lower end thereof and cushion 27*d* is attached to its inner ceiling for absorption of shocks at the insertion as well as easy after control following key operation.

Figure 7A:
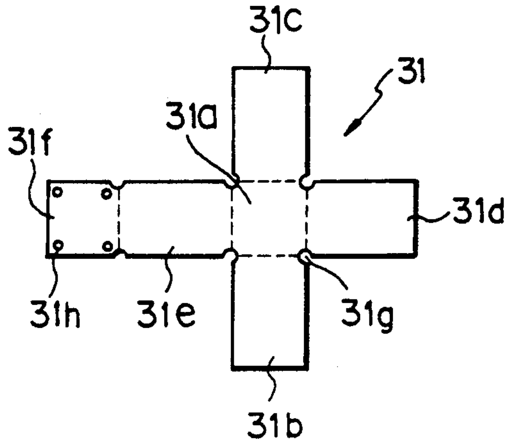
FIG. 7A is an extended view of the coil sheet used for the guide block shown in FIG. 6.

The key guide block 30 is made up of a coil sheet 31 and a coil bobbin 32. The coil sheet 31 is made of thermoplastic resin and made up of five continuous coil face sections 31*a* to 31*e* and an end face section 31*f* as shown in FIG. 7A. The central coil face section 31*a* is provided at its four corners with cutouts 31*g* for easy folding of the sheet and easy insertion of the coil bobbin 32. Dependent coil patterns are formed on the coil face sections 31*a* to 31*e* of the coil sheet 31 in a known manner. Terminals of the coil patterns 31*a* to 31*e* are properly connected on the rear side of the coil sheet 31 and led to holes 31*h* formed in the end face section 31*f*.

Figure 7B:
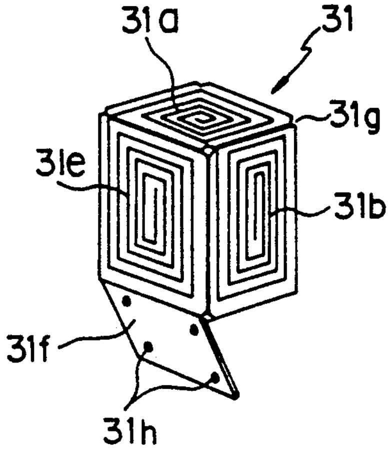
FIG. 7B is a perspective view of the guide block at assembling.
Figure 7C:
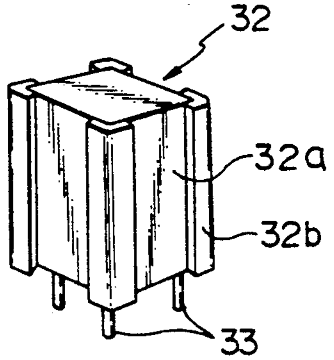
FIG. 7C is a perspective view of one example of the coil bobbin used in combination with the coil sheet shown in FIG. 7A.
Figure 8:
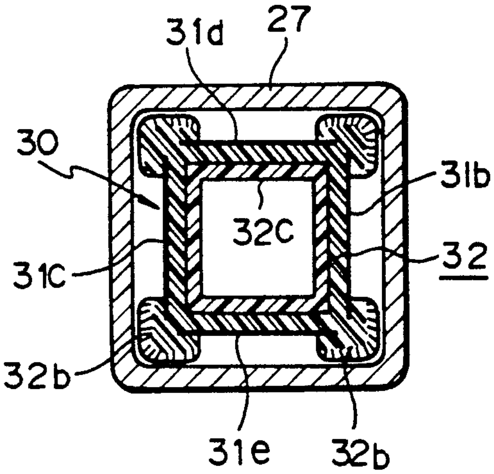
FIG. 8 is a transverse cross-sectional view of the main part of the apparatus shown in FIG. 6.
Figure 9:
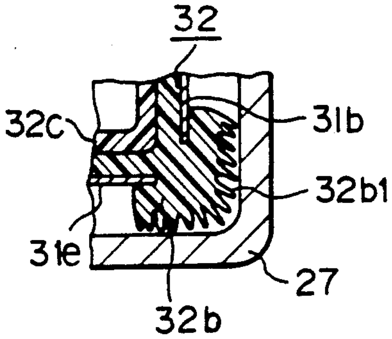
FIG. 9 is an enlarged sectional view of the construction shown in FIG. 8.

The coil bobbin 32 is, as shown in FIG. 7*c*, made up of four coil sheet holding sections 31*f* united together whilst leaving the bottom open and vertical guide rails 32*b* attached to junctions of the holding sections 32*a*. Preferably the coil bobbin 32 is made of an insulating material such as fort vinyl chloride or oily rubber and internally accommodates a cavitious core as shown in FIG. 8. As shown in FIG. 9, each guide rail 32*b* is provided with outer fins 32*b*1 for increased resiliency.

In assembling of the guide block 30, the coil sheet shown in FIG. 7A is somewhat heated and folded into the configuration shown in FIG. 7B which is then inserted over the coil bobbin 32 shown in FIG. 7C. After complete insertion, the end face section 31*f* is bonded to the lower ends of the coil face sections 31*a* to 31*e* to form the construction shown in FIG. 6. Several pins 33 are inserted and fixed to the holes 31*h*. The pins 33 assist fixing of the guide block 30 to the print circuit board 8 shown in FIG. 10 and are also used for electric connection of the coil patterns to an oscillating circuit which will be explained later.

Figure 10:
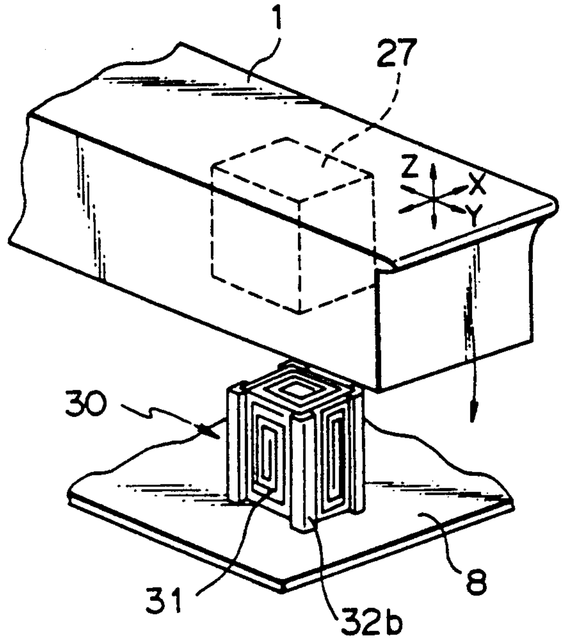
FIG. 10 is a perspective view for showing the operation of the apparatus shown in FIG. 6.

When the key guide block 30 of this construction is received in the key guide cap 27 attached to the lower face of a key 1, the guide rails 32*b* on the coil bobbin 32 contact the inner face of the guide cap 27 as shown in FIG. 8 for smooth movement of the key 1 in the vertical direction i.e. the Z-direction in FIG. 10. Due to the inherent resiliency of the guide rail 32*b* and resiliency of its fins 32*b*1, the gap between the guide block 30 and the guide cap 27 is allowed to change to absorb the slight inclination of the key 1 caused by key operation. The key 1 is further allowed to somewhat move in the X-direction perpendicular to the longitudinal direction of the key 1 as well as in the Y-direction parallel to the longitudinal direction thanks to these resiliencies.

As the key 1 moves in the Z-direction, the mating surface area between each coil face section of the guide block 30 with respect to an associated inner face of the guide cap 27 as well as the gap between the coil face section 31*a* and the inner upper face of the guide cap 27 change. As the key moves in the X-direction, the mating surface areas between the coil face sections 31*d* and 31*e* with respect to the associated inner faces of the guide cap change. Further, movement of the key 1 in the Y-direction causes changes in the gaps between the coil face sections 31*b* and 31*c* and the associated inner faces of the guide cap 27.

Figure 11A:
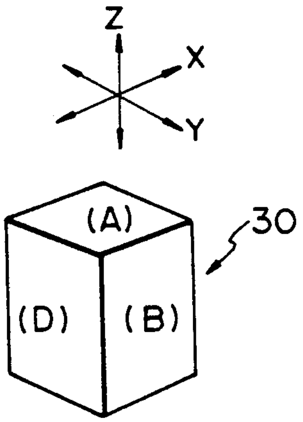
FIG. 11A is a perspective view of a coil sheet in an assembled state.
Figure 11B:
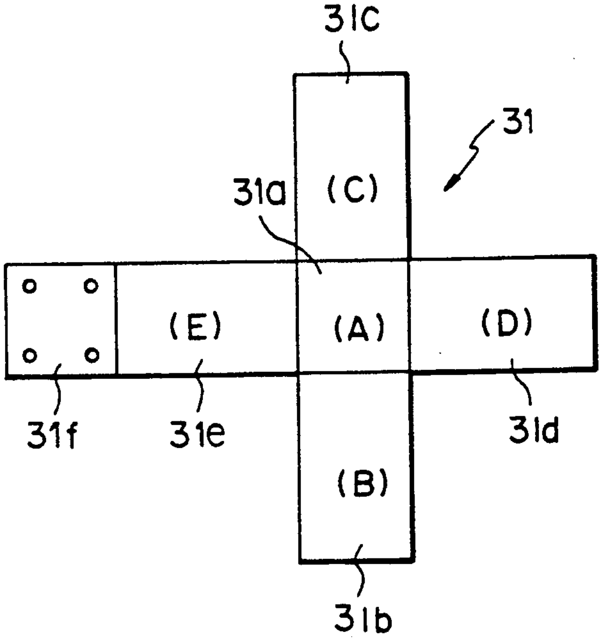
FIG. 11B is a plan view of the coil sheet in an extended state.

The change in mating surface area causes a corresponding substantially linear change in coil inductance and change in gap causes a corresponding parabolic change in coil inductance. The relationship between the key movement and the corresponding change in coil inductance will be explained in more detail in reference to FIGS. 11 to 13. The assembled condition of the coil sheet 31 is shown in FIG. 11A and the extended condition thereof is shown in FIG. 11B. The symbols X, Y and Z indicate the moving direction of the key 1 just as in FIG. 10. The coil patterns La to Le are formed on the coil face sections A to E on the guide block 30.

Figure 12A:
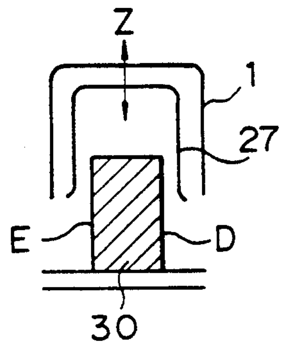
FIGS. 12A to 12D are simplified views for showing key movements in various directions.
Figure 13A:
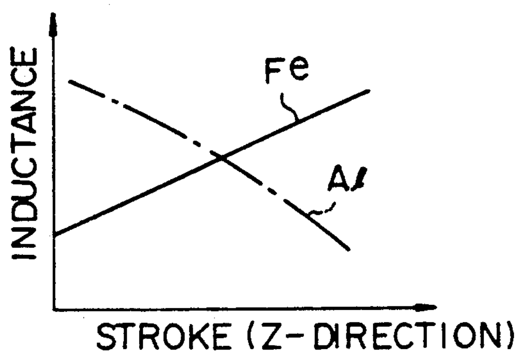
FIGS. 13A to 13D are graphs for showing relationship between coil inductance and key stroke for various directions of the key movement.

When the key 1 moves in the Z-direction as shown in FIG. 12A, the mating surface areas of the faces E and D increase in a substantially linear mode as the stroke increases. As a result, inductance of the coil patterns Le and Ld increases for an Fe guide cap and decreases for an Al guide cap, both substantially in a linear mode as shown in FIG. 13A.

Figure 12B:
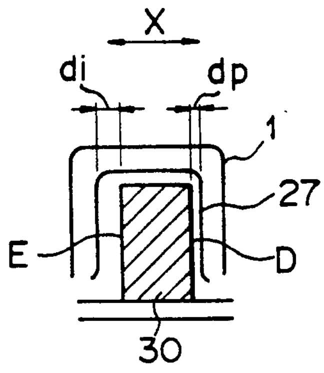
Figure 13B:
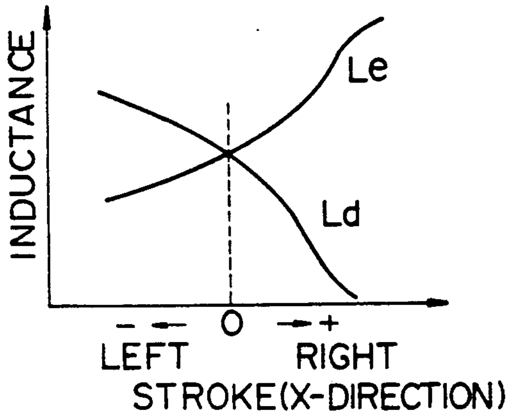

When the key 1 moves in the X-direction as shown in FIG. 12B, the gaps di and dp of the faces E and D change delicately. As a result, inductance of the coil patterns Le and Ld changes as shown in FIG. 13B. Reverse mode of changes are exhibited by the Fe and Al guide caps. This difference is also observed in other cases.

Figure 12C:
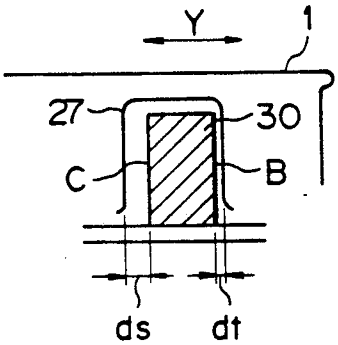
Figure 12D:
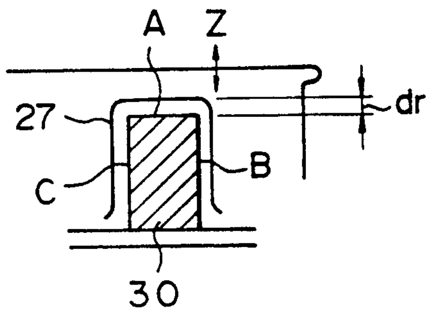
Figure 13C:
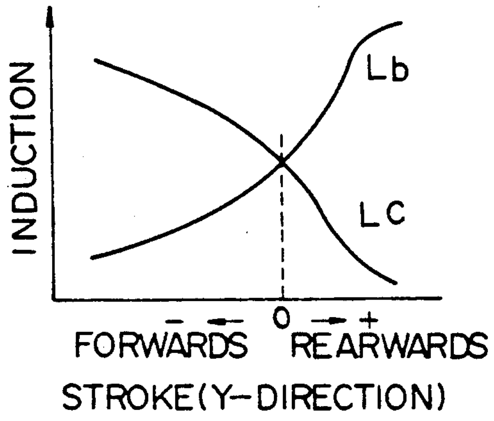

When the key 1 moves in the Y-direction as shown in FIG. 12C the gaps ds and dt of the faces B and C change delicately. As a result, inductance of the coil patterns Lc and Lb changes as shown in FIG. 13C.

Figure 13D:
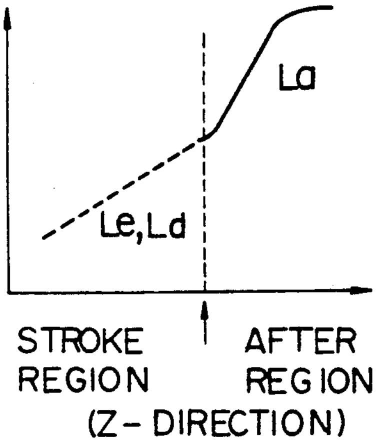

At about the end of key operation over the stroke, the key 1 further moves in the Z-direction pressing the cushion 27*d* shown in FIG. 6 and the distance dr between the face A on the guide block 30 and the inner upper face of the guide cap 27 changes accordingly. As a result, inductance of the coil pattern La changes as shown in FIG. 13D. The dotted line shows change in coil inductance of the coil patterns Le and Ld during the key stroke. This change in inductance of the coil pattern La can be used as an after touch signal. When this coil pattern La is connected to the coil pattern Le or Ld, the change in coil inductance can be used as a part of a key stroke signal.

Figure 14:
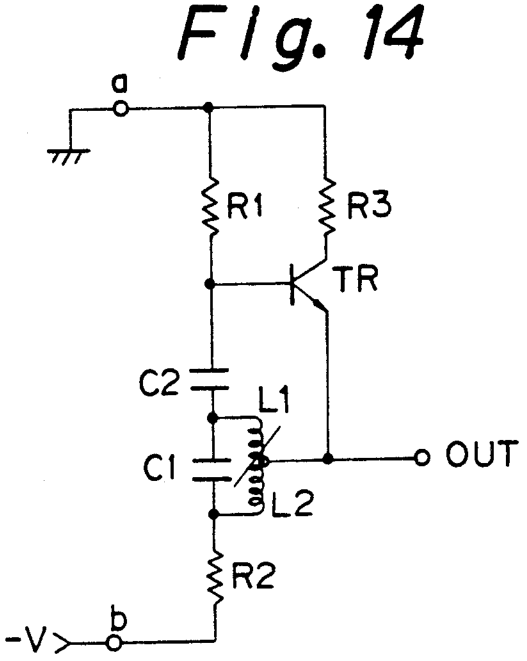
FIG. 14 is a circuit diagram of one example of an oscillator used for picking up change in coil inductance.

For picking up the change in coil inductance, an oscillator including an LC circuit is preferably used. One example of such an oscillator is shown in FIG. 14 in which a emitter tuning type Hartrey oscillator is made up of a NPN type transistor TR, capacitors C1, C2, coils L1, L2 and resistors R1 to R3. In the case of the illustrated example, a power source terminal a is earthed for application of negative voltage (V). As a substitute, another terminal b may be earthed for application of positive voltage (V) to the power source terminal a.

The oscillating frequency, i.e. the frequency of an output signal from its output terminal OUT is given by the following equation.

$$f = \frac{1}{2}\pi (LC)^{\frac{1}{2}} \text{ Hz}$$

$$L = L1 + L2 + 2M$$

$$M \approx (L1 \cdot L2)^{\frac{1}{2}}$$

L1; inductance of the coil L1

L2; inductance of the coil L2

From this equation, it is well understood that an increase in coil inductance leads to lowering in oscillating frequency. When the foregoing coil patterns Le and Ld on the guide block 30 (see FIG. 15) are used for the coils L1 and L2, a decrease in coil inductance in correspondence to the key stroke in the Z-direction as shown in FIG. 13A causes a corresponding change in the oscillating frequency f. Such a change in the oscillating frequency is used for adjustment of, for example, the tone volume of a musical tone to be generated.

When the foregoing coil patterns La on the guide block 30 is used for the coils L1 and L2 with assistance of a middle point tap, the resultant change in its output frequency is picked up as a after touch signal for after control of a musical tone to be generated.

When the above-described coil pattern Le or Le is used for the coils L1 and L2 with assistance of a middle point tap, key movement in the X-direction can be detected. Use of the coil pattern Lb or Lc enables detection of key movement in the Y-direction.

Such separate picking up system necessitates use of several oscillators for each key. In the case of the example shown in FIGS. 16 and 17, only one set of oscillator is needed for detection of various key movement.

Figure 15:
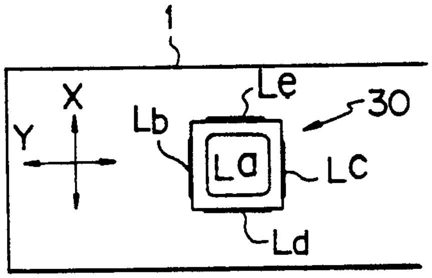
FIG. 15 is a simplified plan view of the key guide block bearing coil patterns.
Figure 16A:
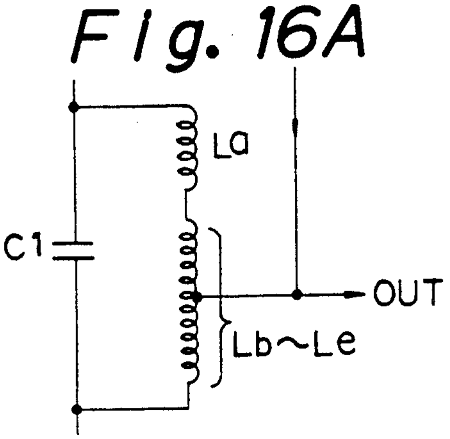
FIGS. 16A to 16D are circuit diagrams of various oscillators of series connection used for picking up change in coil inductance.

In the case of the example shown in FIG. 16A, the coil patterns Lb and Le in FIG. 15 are used in series connection and the coil pattern La is further connected thereto in series for detection of the key and after strokes in the Z-direction.

Figure 16B:
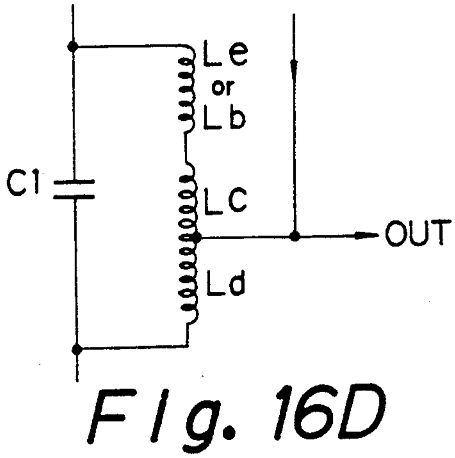

In the case of the example shown in FIG. 16B, the coil patterns Lc and Ld are combined in series connection and the coil pattern Le further connected thereto in series for detection of the key stroke in the Z-direction and movement of the key in the X-direction. When the coil pattern Lb is used as a substitute of the coil pattern Le, key movement in the Y-direction can be detected.

Figure 16C:
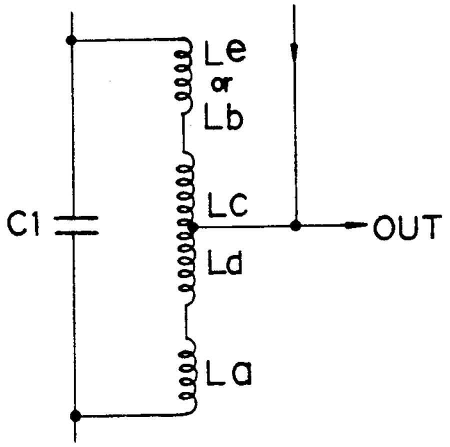
Figure 16D:
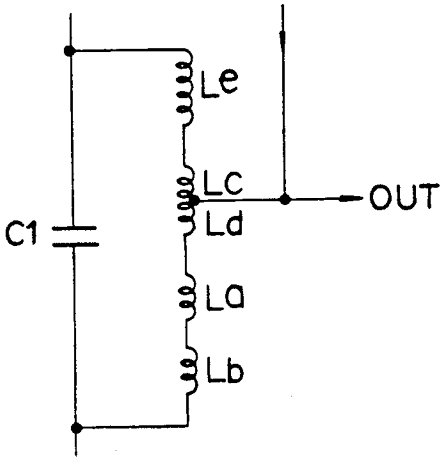

In the oscillator shown in FIG. 16C, the coil pattern La is further connected in series to the above-described combination of the coil patterns Lc, Ld and Lb or Le for detection of the after stroke in the Z-direction. In the arrangement shown in FIG. 16D, all the coil patterns La to Le are connected in series for detection of all the key movements.

Figure 17A:
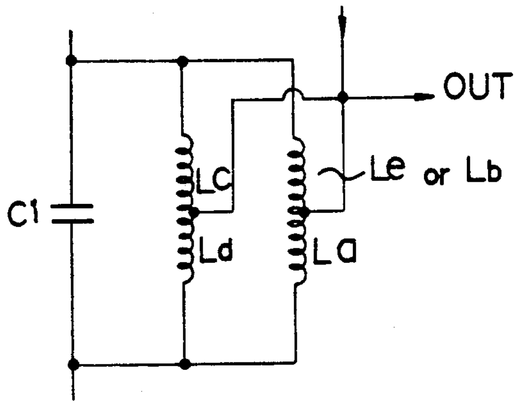
FIG. 17A to 17C are circuit diagrams of various oscillators including parallel connection used for picking up change in coil inductance.
Figure 17B:
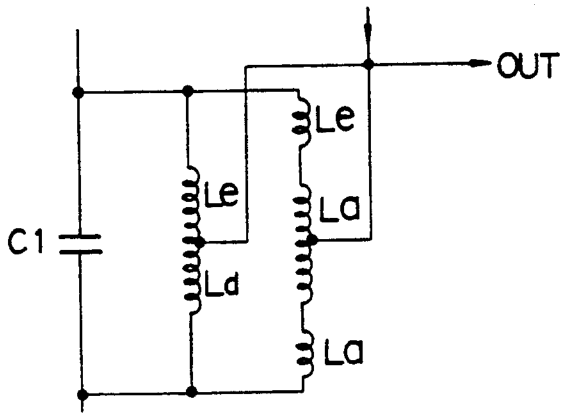
Figure 17C:
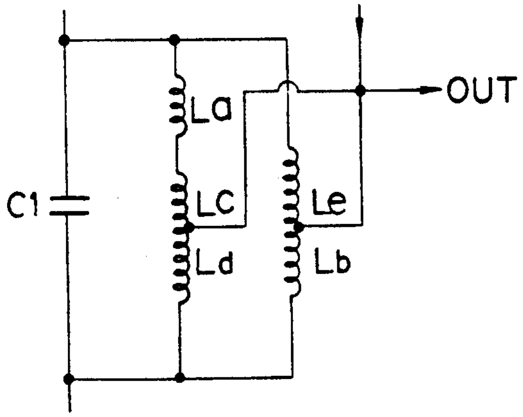

In the case of the arrangement shown in FIGS. 17A to 17C, the coil patterns are connected not only in series but also in parallel. Their operations are basically same as those of the arrangements in FIGS. 16A to 16D. When separate oscillators are used for separate keys or two or more oscillators are used for each key, not only tone volume but also other musical tone control parameters can be carried out independently. When only one oscillator is used for each key, the oscillator performs one of such controls or carries out such controls at different moments.

Figure 18:
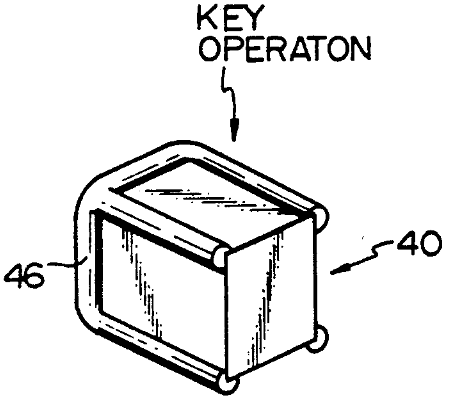
FIG. 18 is a perspective view of one embodiment of the key guide block.
Figure 19A:
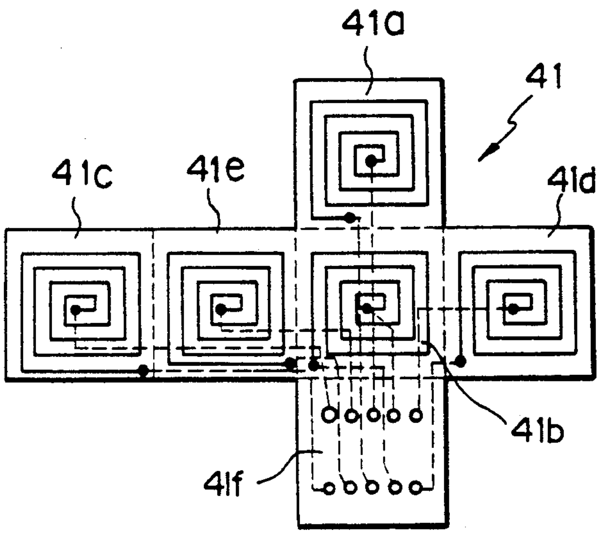
FIGS. 19A to 19D are extended views of various coil sheets used for the guide block shown in FIG. 18.
Figure 19B:
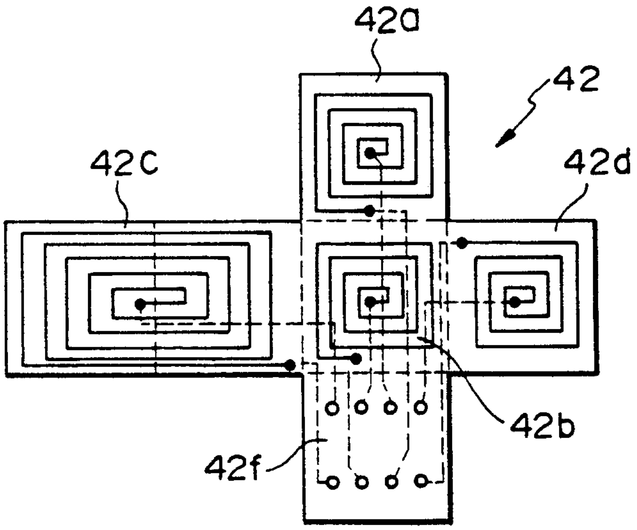
Figure 19C:
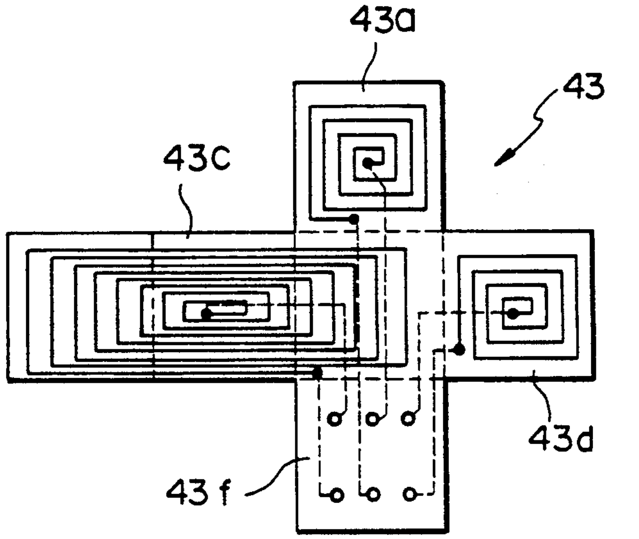
Figure 19D:
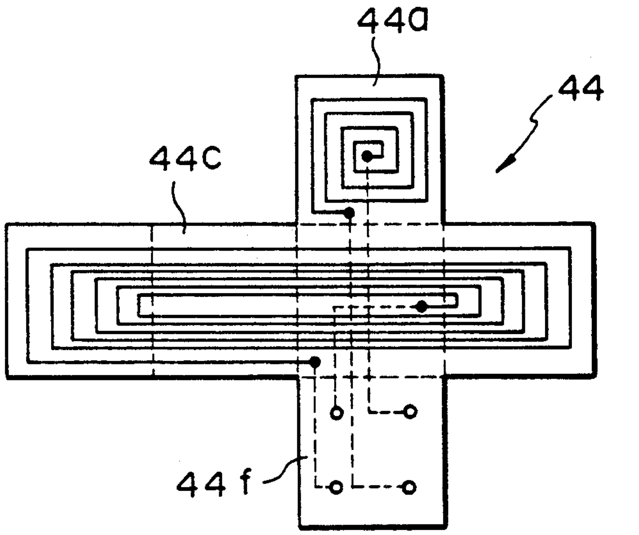

The fourth embodiment of the apparatus in accordance with the present invention is shown in FIGS. 18 to 20, in which a box type key guide block 40 is provided with guide rails 46 made of resin. Various dispositions of coil patterns are shown in FIGS. 19A to 19D. In the disposition shown in FIG. 19A, independent coil patterns 41*a* to 41*e* are formed on the upper, front, left and rear coil face sections of a coil sheet 41 and both ends of each coil pattern are connected to terminals arranged on an end face section 41*f*. In the case of the disposition shown in FIG. 19B, independent coil patterns 42*a*, 42*b* and 42*d* are formed on the upper, front and right coil face sections of a coil sheet 42 and a coil pattern 42*c* is formed extending over the rear and left coil face sections and terminals of the coil patterns are arranged on an end face section 42*f*. In the case of a coil sheet 43 shown in FIG. 19C, independent coil patterns 43*a* and 43*d* are formed on the upper and right coil face sections and a coil pattern 43*c* is formed extending over the rear and front coil face sections. The terminals of the coil patterns are arranged on an end face section 43*f*. In the coil sheet 44 shown in FIG. 19D, an independent coil pattern 44*a* is formed on the upper coil face section and another coil pattern 42*c* is formed extending over the rear, left, front and right coil face sections. An end face section bears terminals of these coil patterns.

Figure 20A:
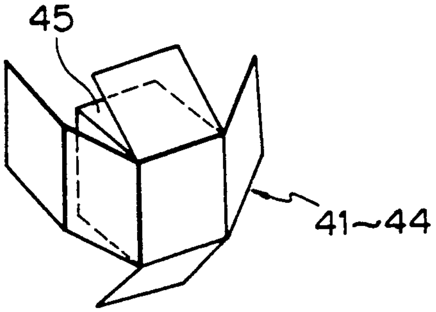
FIG. 20A is a perspective view of assembling of the coil sheet.
Figure 20B:
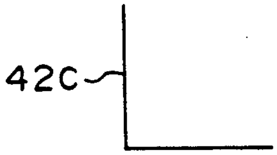
FIGS. 20B to 20D are top views of various dispositions of coil patterns on the guide block.
Figure 20C:
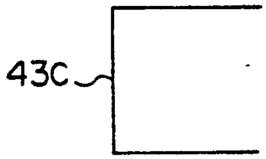
Figure 20D:
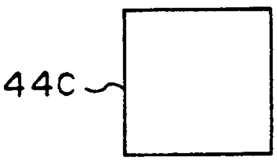

Each of the coil sheets 41 to 44 is folded as shown in FIG. 20A after proper heating and bonded to a box type coil bobbin 45 to form the guide block such as shown in FIG. 18. With the above-described disposition of the coil patterns, the coil pattern 42*c*, 43*c* and 44*c* are positioned on the faces of the coil bobbin 45 as shown in FIGS. 20B to 20D to reserve the maximum mating surface area with respect to the associated inner faces of a guide cap, thereby resulting in large change in coil inductance. With assistance of proper middle point taps, the coil patterns can function as the coil patterns L1 and L2 shown in FIG. 14 so that key operation should produce large frequency change of the output signal.

The following descriptions will be directed to circuits for processing signals generated by the above-described keyboard apparatus in accordance with the present invention.

Figure 21:
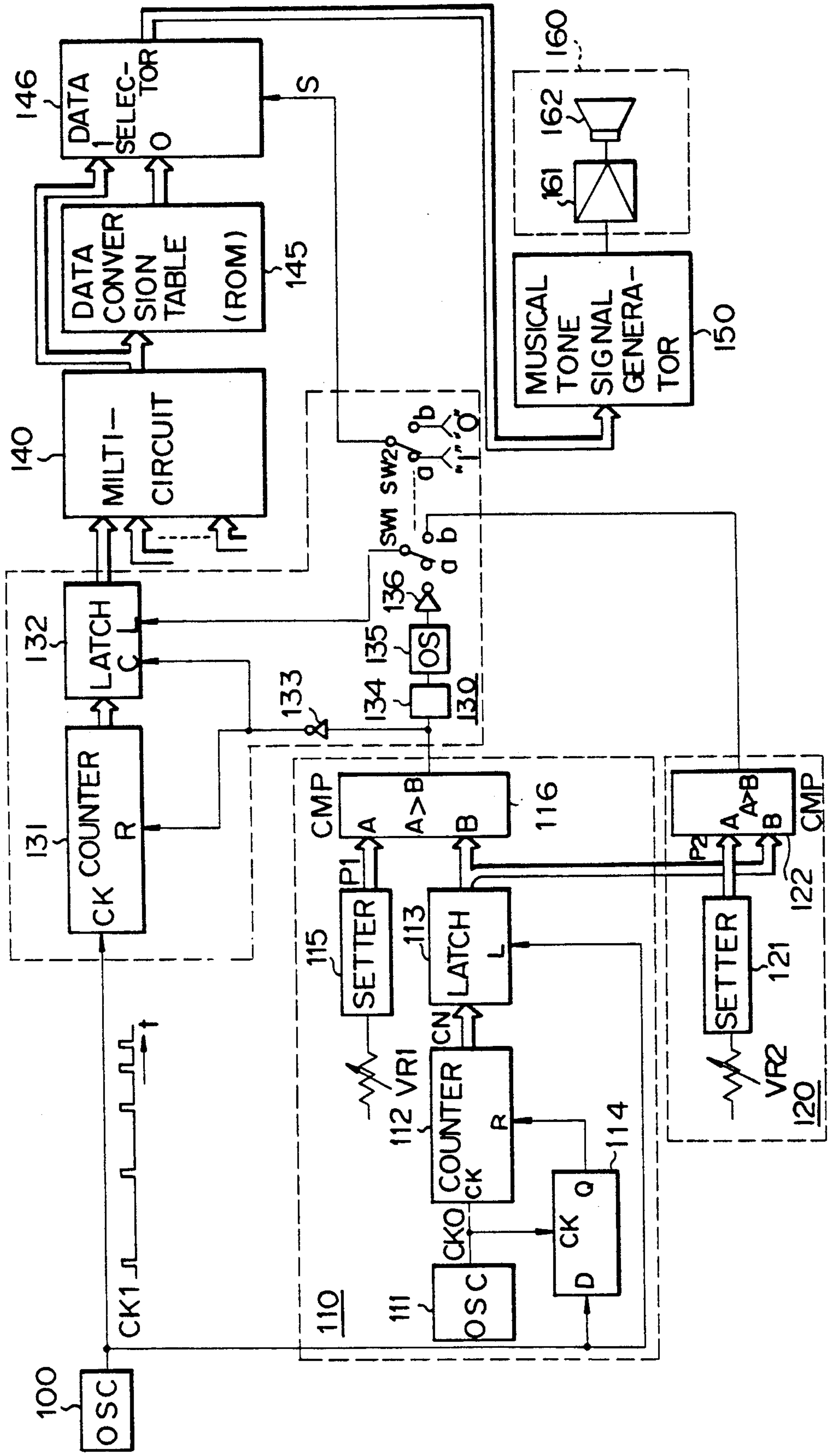
FIG. 21 is a circuit diagram of one example of a signal processing circuit usable for the apparatus in accordance with the present invention.

The first example of such a signal processing circuit is shown in FIG. 21 in which the circuit includes, as major elements, an oscillator 100, a keying detection circuit 110 connected to the output side of the oscillator 100, a keying terminal detection circuit 120 connected to the output side of the keying detection circuit 110, a touch data formation circuit 130 connected to the output sides of the foregoing major elements, a multi-circuit 140, a data conversion table 145, a data selector 146, a musical tone signal generator 150 and a sound system 160 connected to the musical tone signal generator 150. Among those elements, the oscillator 100, the keying detection circuit 110, the keying terminal detection circuit 120 and touch data formation circuit 130 are each arranged one for each key 1.

The oscillator 100 is given in the form of one of those shown in FIGS. 14, 16 and 17 and generative of output signals CK1 to be passed to a counter 131 of the touch data formation circuit 130. It is assumed in the following description that the guide cap or the guide block is made of Al, that the coil inductance decreases in a linear mode as shown in FIG. 13A as the key stroke increases at key operation, and that the frequency of the output signals CK1 increases accordingly. Thus the output signal CK1 has a relatively long constant period T1 which becomes shorter on initiation of key operation depending on instant key strokes.

The keying detection circuit 110 includes a high speed oscillation circuit 111 constantly in operation, a counter 112 for counting high speed clock pulses CK0 issued by the oscillation circuit 111, a latch 113 for latching count values CN issued by the counter 112, a D-type flip-flop 114 for generating a reset signal for the counter 112, a setter 115 whose preset value P1 can be freely set by manual adjustment of a volume VR1 and a comparator 116 having an A terminal receptive of the preset value P1 and a B terminal receptive of the latched count values from the latch 113. When the input at the A terminal is larger than that at the B terminal, the comparator 116 issues a keying signal of level "1".

The keying terminal detection circuit 120 includes a setter 121 whose preset value P2 can be freely set by manual adjustment of a volume VR2 and a comparator 122 having an A terminal receptive of the preset value P2 and a B terminal receptive of the latched count values from the latch 113 of the keying detection circuit 110. When the input at the A terminal is smaller than that at the B terminal, the comparator 122 issues a keying terminal signal of level "1".

The touch data formation circuit 130 includes a counter 131 for counting pulse signals CK1 issued by the oscillator 100, a latch 132 for latching count values from the counter 131, a NOT gate 133 for passing the output of the comparator 116 to the counter 131 as a reset signal after inversion, a differential circuit 134 for obtaining a latch signal for the latch 132 from the output of the comparator 116, a one-shot multi-vibrator 135, a NOT gate 136 for inverting the output of the multi-vibrator 135 and a pair of switches SW1 and SW2.

Figure 22:
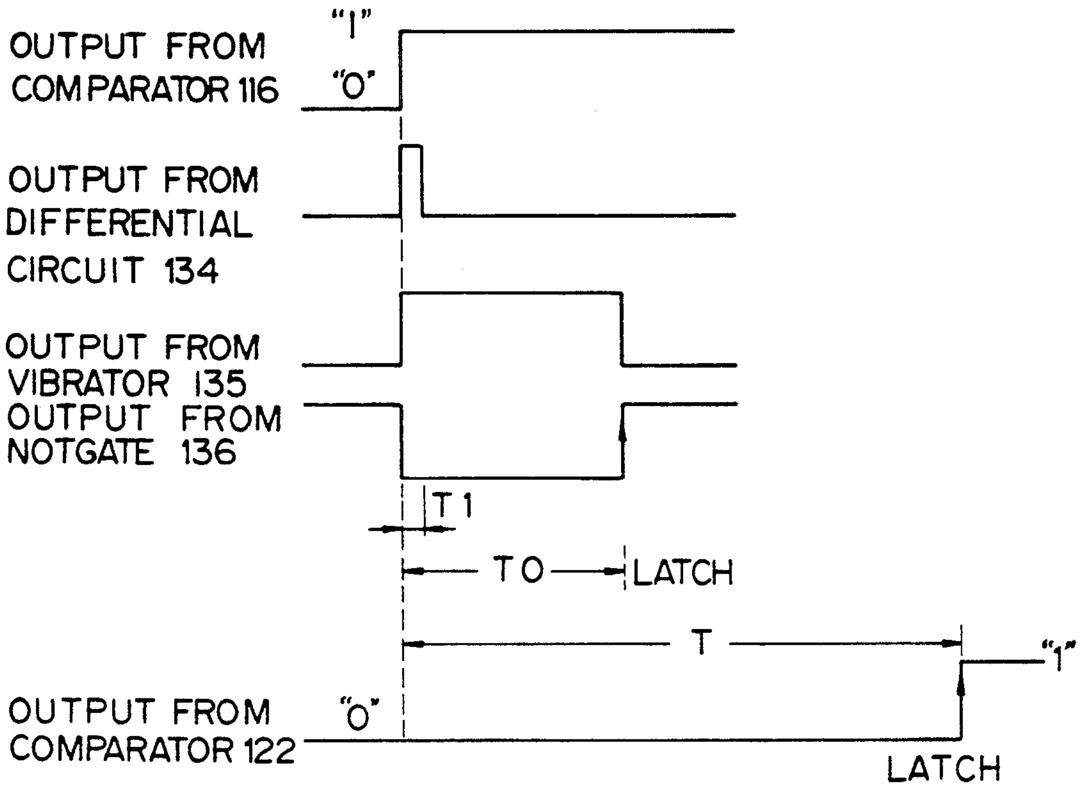
FIGS. 22 and 23 are timing diagrams of signals processed in the circuit shown in FIG. 21.

The operation of the signal processing circuit will now be explained in reference to FIGS. 22 and 23.

The first preset value P1 is set to a value somewhat smaller than the count value at the counter 112 when reset at the period of the pulse signal CK1 at no key operation, i.e. the maximum value $C_{MAX}$ latched by the latch 113. For example, this value is set to about 90 to 95 degrees when $C_{MAX}$ is equal to 100. Whereas the second preset value P2 is set to a value somewhat larger than the count value at the counter 112 when reset at the period of the pulse signal CK1 at the maximum key stroke, i.e. the minimum value $C_{MIN}$ latched by the latch 113. For example, this value is set to about 24 degrees when $C_{MIN}$ is equal to 20.

In the keying detection circuit 110, the counter 112 counts the clock pulses CK0 of short period from the oscillation circuit 111. On receipt of the pulse signal CK1 from the oscillator 100, its count value CN at that moment is latched by the latch 113. Then, the reset signal from the flip-flop 114 is set to level "1" with a delay of one period of the clock pulse CK0 to reset the counter 112 which restarts counting of the clock pulses CK0 from the beginning. Thus, the output from the latch 113 is always close to the maximum value $C_{MAX}$ at no key operation and larger than the first preset value P1 given by the setter 115. As a consequence, the A terminal input is smaller than the B terminal input at the comparator 116 whose output is accordingly kept at level "0". The B terminal input is smaller than the A terminal input (the second preset value P2) at the comparator 122 in the keying terminal detection circuit 120 and its output is accordingly kept at level "0" too.

As long as the output from the comparator 116 is at level "0", the output from the NOT gate 133 is kept at level "1" to continue to reset the counter 131. As a consequence, no touch data are issued.

When key operation is initiated with the switches SW1 and SW2 being connected to the a terminal in FIG. 21, the period T1 of the pulse signals CK1 from the oscillator 100 becomes gradually shorter, the count value CN of the counter 112 is latched by the latch 113 before reaching the maximum value $C_{MAX}$, and the counter 112 is thereafter reset. As a result of this reset, the A terminal input becomes larger than the B terminal input at the comparator 116 which thereupon issues an output at level "1" as shown in FIG. 22. The rise of this output is used as the keying signal or the key on signal.

The output from the comparator 116 is inverted at the NOT gate 133 to level "0" to cancel the reset state of the counter 131 which initiates counting of the pulse signals CK1. At the rise of the output of the comparator 116, the differential circuit 134 issues a pulse as shown in FIG. 22 to trigger the multi-vibrator 135 whose output is then set to level "1". After a certain prescribed period T0, this output is set back to level "0". This output from the multi-vibrator 135 is inverted at the NOT gate 136 and its output rises at a time of T0 after initiation of its counting of the pulse signals CK1. This output form the NOT gate 136 is passed to the latch 132 via the switch SW1 as a latch signal, and the latch 132 latches the instant count value from the counter 131 to issue it as the touch data.

In this case the touch data takes the form of initial touch data based on the count value of the counter 131 at a time of a certain period from initiation of its counting operation. The higher the key operation speed, i.e. the stronger the key touch, the larger the touch data.

When the switches SW1 and SW2 are both connected to the b terminals, the latch 132 latches the count value form the counter 131 at rise of the output from the comparator 122 to level "1" to issue the touch data. That is, when the key reaches its lowermost position, the period T1 of the pulse signals CK1 becomes shorter and the count value CN of the counter 112 to be latched becomes smaller than the preset value P2 of the keying terminal detection circuit 120. As a result, the output from the comparator 122 is set to level "1" as shown in FIG. 22. In this case the touch data are given in the form of count values covering a period from initiation of the counting operation to the end of key movement. Assuming that the key stroke is constant regardless of the strength of key operation, the faster the key operation, the smaller the touch data.

As the key starts to return from its lowest position, the period T1 of the pulse signals CK1 again becomes gradually longer and the count value CN latched by the latch 113 becomes larger. The output from the comparator 122 first returns to level "0" and that from the comparator 116 next returns to level "0". This condition sets the output from the NOT gate 133 to level "1" to reset the counter 131 and clear the latch data at the latch 132. By setting the first preset value P1 somewhat smaller than the maximum count value $C_{MAX}$ of the counter 112, unstable condition or error in operation of the touch data, which would otherwise be caused by a slight key movement during the initial period of key operation or just after key operation, can be well avoided. By proper setting of the preset values P1 and P2, insensible zones of adjustable lengths can be formed in the initial and terminal periods of the key operation.

The above-described signal processing circuit is provided one for each key and the initial touch data from the latch 132 of the touch data formation circuit 130 are passed to the multi-circuit 140. The multi-circuit 140 transfers the initial touch data to the data conversion table 145 and to the data selector 146 by time division principle, respectively.

Figure 23:
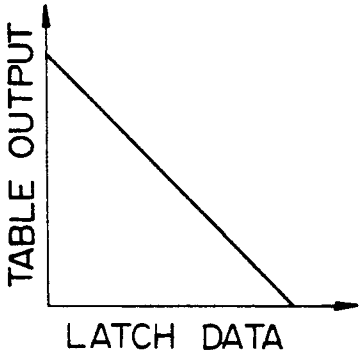

The data conversion table 145 is given in the form of a read only memory including a table for converting the initial touch data from the multi-circuit 140 to data which is reverse proportional in size to the initial touch data as shown in FIG. 23. The data selector 146 operates to select an input 1 for a select signal S of level "1"

from the switch SW2 and an input 2 for a select signal S of level "0", respectively.

When the switches SW1 and SW2 are connected to the a-terminal and the latch 132 latches the count value issued by the counter 131 at a time T0 from initiation of its counting operation, the initial touch data from the multi-circuit 140 is passed to the musical tone signal generator 150 via the data selector 146 without any change.

When the switches SW1 and SW2 are connected to the b-terminal and the latch 132 latches the count value issued by the counter 131 at a time T from initiation of its counting operation, the initial touch data from the multi-circuit 140 is passed to the musical tone signal generator 150 after the above-described reverse proportional conversion at the data conversion table 145.

The musical tone signal generator 150 generates basically a musical tone of a tonal pitch corresponding to the operated key. This generator 150 is additionally able to adjust various musical tone control parameters such as tone volume level, tone colour, pitch variation and so on corresponding to the value of the touch data received from the data selector 146, thereby generating a musical tone reflecting the emotion of the player with complete fidelity.

The musical tone signal issued by the generator 150 is passed to the sound system 160 made up of, for example, an amplifier 161 and a speaker 162 for generation of a corresponding musical tone via electro-acoustic conversion.

The above-described signal processing circuit can be used only one for all the key when time division principle is employed. The function of the signal processing circuit may be replaced by operation of a micro computer.

Figure 24:
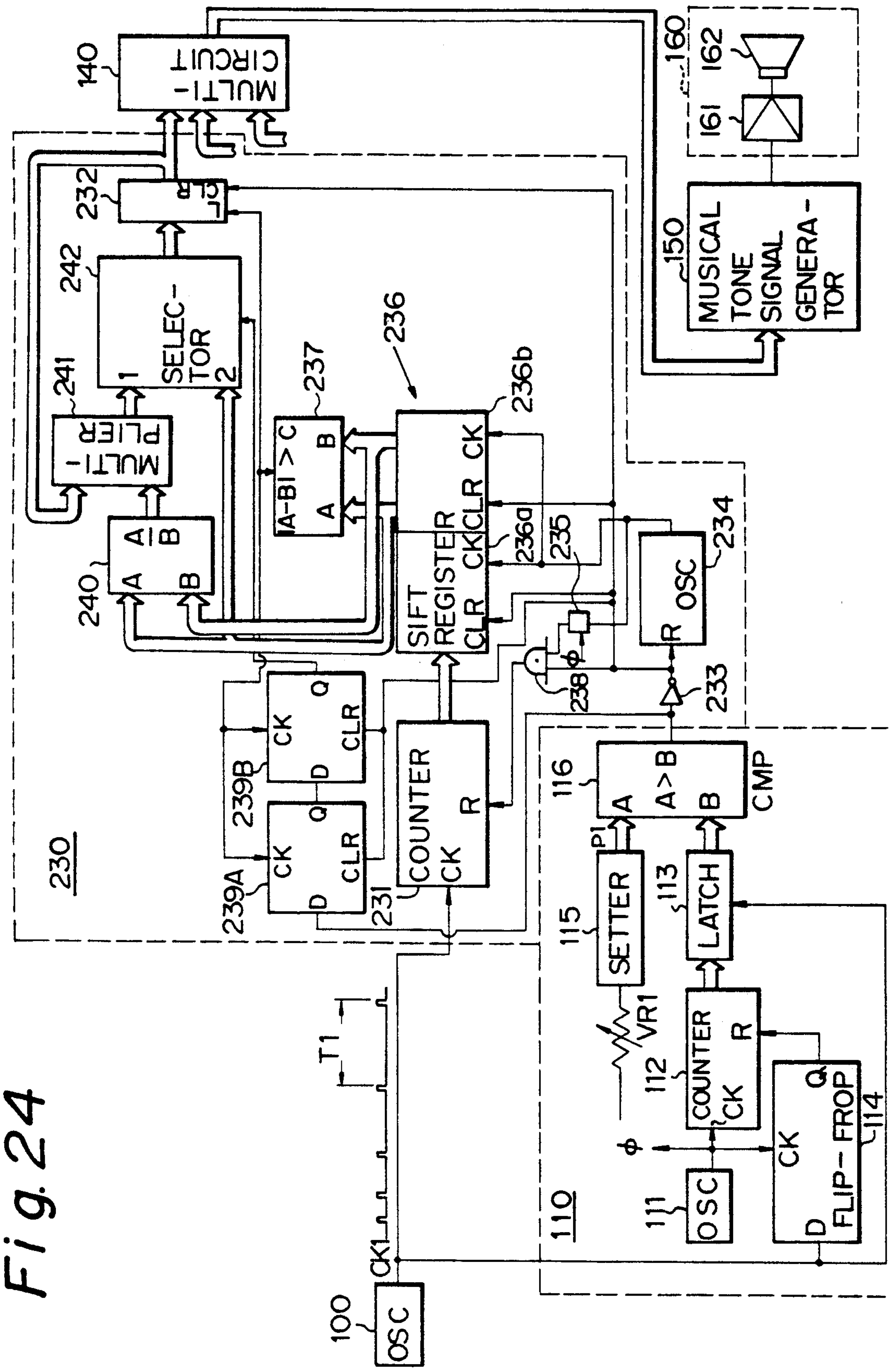
FIG. 24 is a circuit diagram of another example of a signal processing circuit usable for the apparatus in accordance with the present invention.
Figure 25:
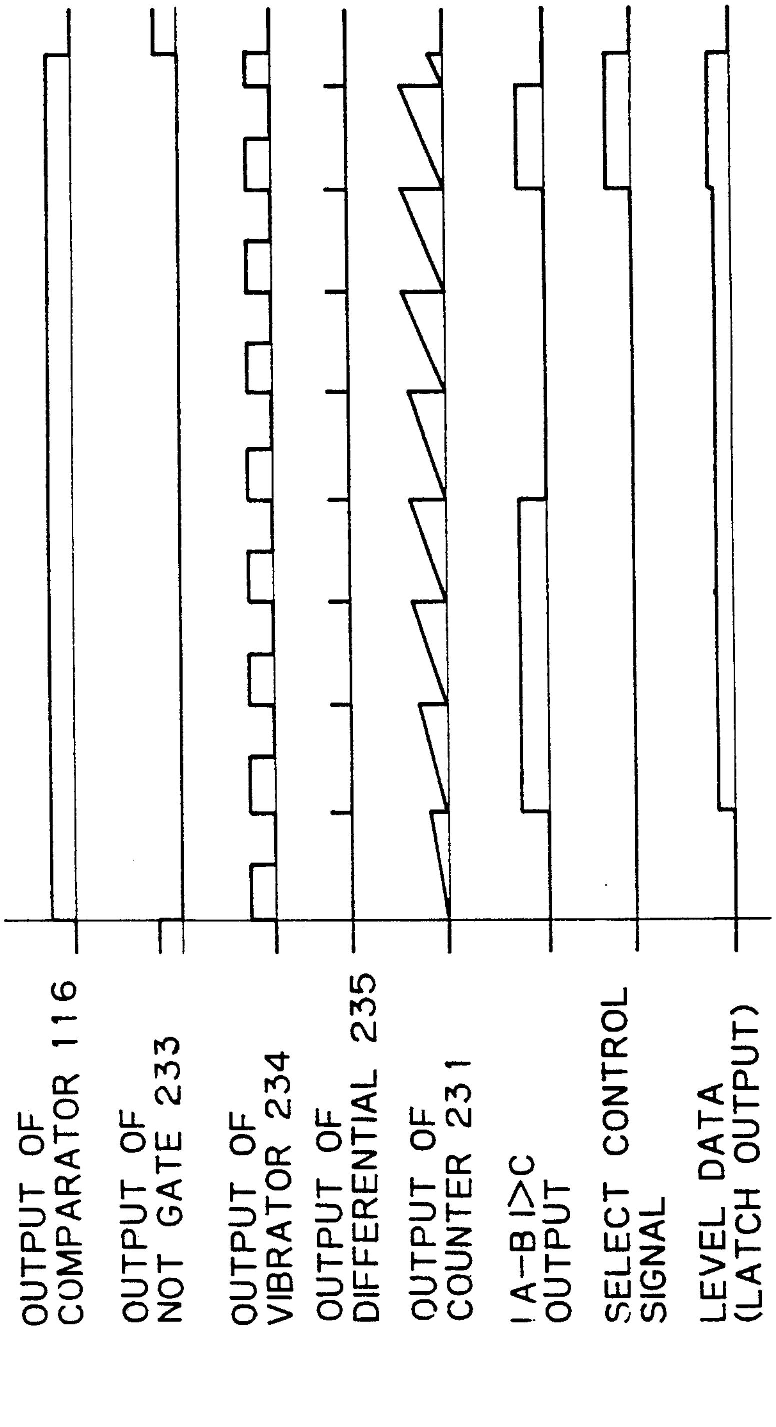
FIG. 25 is a timing diagram of signals processed in the circuit shown in FIG. 24.

The second example of the signal processing circuit usable with the apparatus in accordance with the present invention is shown in FIGS. 24 and 25. This circuit is basically different from that shown in FIG. 21 in that the touch data formation circuit 130 is replaced by a touch data formation circuit 230 and that the keying terminal detection circuit 120, the data conversion table 145 and the data selector 146 are removed. The other parts are substantially same as those in the circuit shown in FIG. 21.

The touch data formation circuit 230 in this example is adapted for formation of not only the initial touch data but also after touch data. More specifically, the touch data formation circuit 230 includes a counter 231, a latch 232 and a NOT gate 233 as in the foregoing example. In addition, the circuit 230 includes a low speed oscillator 234, a differential circuit 235 connected to the oscillator, an OR gate 238 connected to the output sides of the oscillator and the differential circuit, a two-stage shift register 236 for provisionally storing the count values of the counter 231, a change detection circuit 237 for detecting change in count value from the counter 231 and a pair of D-type flip-flops 239A and 239B.

The detection circuit 237 has a terminal receptive of an input A from the former stage 236*a* of the shift register 236 (i.e. the count value in the current cycle) and a terminal receptive of an input B from the later stage 236*b* of the shift register 236 (i.e. the count value of the preceding cycle). This detection circuit 237 issues an input of level "1" when the value of $|A-B|$ exceeds a prescribed value C, C being a small value such as 1 to 3 for prevention of error in operation. In this way, the detection circuit 237 detects key movement.

A divider 240 is provided for calculation of a ratio A/B and a multiplier 241 for multiplying the output of the divider with the latch data from the latch 232. A selector 242 is also provided to select one of the result of multiplication and the output A from the shift register 236.

Operation of the circuit will now be explained in detail on the assumption that the key guide cap is made of Al, that coil inductance decreases as the key stroke increases and that the frequency of the pulse signals CK1 from the oscillator 100 becomes higher with decrease in their period T1. Further, the oscillation frequency of the oscillator 100 is f1, that of the oscillator 111 is f2 and that of the oscillator 234 is f3. These frequencies have a relationship $f2>f1>f3$. Generally, the frequency f1 is in the order of 10 KHz, the frequency f2 is on the order of 1 MHz and the frequency f3 is on the order of 100 Hz.

As the key moves downwards to a prescribed position at key operation, the output from the comparator 116 rises to level "1" as shown in FIG. 25, which is used as the key on signal. This output is reversed at the NOT gate 233 to cancel the reset condition of the counter 231 which thereupon initiates counting of the pulse signals CK1. This key on signal also cancels the reset condition of the oscillator 234 which thereupon issues pulse signals of a constant period as shown in FIG. 25.

The rise of each pulse signal is used for triggering the shift register 236 and its former stage 236*a* stores the count value of the counter 231. At this stage of operation, the later state 236*b* remains cleared and its output is at level "0". The rise of each pulse signal is passed through the differential circuit 235 and its output pulse is passed to the reset terminal of the counter 231 via the OR gate 238. A relationship $|A-B|>C$ is established at the detection circuit 237 at this moment which issues an output at level "1".

This output is passed to the latch 232 as a latch signal and to the flip-flops 239A and 239B as clock signals. The flip-flop 239A issues an output at level "1" whereas the flip-flop 239B issues an output at level "0". As a result, the data selector 242 transfers the input "0" to the latch 232 which thereupon latches the count value stored at the former stage of the shift register 236 and issues a level data such as shown in FIG. 25 as the initial touch data.

Then at the next rise of the output from the oscillator 234, the count value stored in the former stage is transferred to the later stage at the shift register 236 and the former stage stores a new count value from the counter 231. Since the new count value is larger than the old one, a relationship $|A-B|>C$ is established at the detection circuit 237 which then keeps the output at level "1". As a result, there is no change in latch data at the latch 232 and, as a consequence, there is no change in condition of the flip-flops 239A and 239B.

This condition is maintained until the terminal period of the key stroke. As the key operation terminates, there appears no substantial change in count value of the counter 231 and the outputs from both stages of the shift register 236 become almost same. No relationship $|A-B|>C$ is now satisfied at the detection circuit 237 whose output then returns to level "0". This condition is maintained as long as the key is at the lowermost position. When the key is further depressed, for example compressing the cushion 27*d* shown in FIG. 6, the count value of the counter 231 during a prescribed period again increases and a relationship $|A-B|>C$ is again established at the detection circuit 237 whose output is again set to level "1" as shown in FIG. 25.

The clock pulses are passed to the flip-flops 239A and 239B and the flip-flop 239A issues an output at level "1" and the condition at the selector 242 changes to input 1. Then the divider 240 calculates the value A/B which is multiplied at the multiplier 241 to the level data from the latch 232. A corresponding output from the multiplier 241 is passed to the latch 232 via the data selector 242. Corresponding level data from the latch 232 increase in proportion to percent change in count value and are used as the after touch data for musical tone control.

As the key returns to its initial position, the output from the comparator 116 returns to level "0" which is inverted at the NOT gate 233 to reset the counter 231 and to clear the shift register 236 and the latch 232.

In the case of this example, the initial and after touch data can be detected by a single common circuit.

Figure 26:
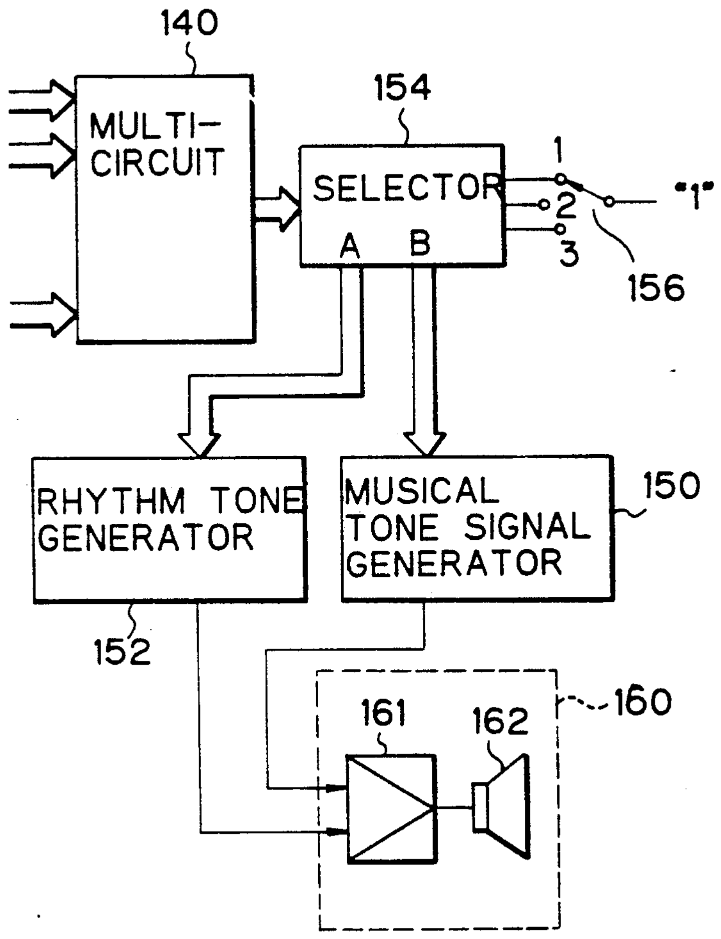
FIG. 26 is a circuit diagram of the main part of a modification of the circuit shown in FIG. 24.

A modification of the foregoing circuit is shown in FIG. 26 in which a selector 154 accompanied with a selector switch 156 is interposed between the multi-circuit 140 and the sound system 160 and a rhythm tone signal generator 152 is connected in parallel to the musical tone signal generator 150, both for percussion mode performance.

The rhythm tone signal generator 152 issues a percussion mode rhythm tone signal on every key operation. The selector switch 156 is set to a terminal 1 for ordinary mode performance by the musical tone signal generator 150, to a terminal 2 for percussion mode performance by the rhythm tone signal generator 152 and to a terminal 3 for mixed mode performance by both generators 150 and 152. The selector 154 controls connection to the generators 150 and 152.

We claim:

1. A keyboard apparatus in which a plurality of keys are swingably mounted to a fixed key support and a change in electrical inductance is induced in response to every key operation in order to control musical tone control parameters comprising:

means for inducing said change in inductance attached to one of said key and said key support, and at least one planar coil pattern for detecting said change in inductance, said coil pattern attached to one of said key and said key support such that said coil pattern is in a face-to-face relationship with said inducing means, wherein the mating surface area of the coil pattern with respect to said inducing means changes substantially linearly in correspondence with the key stroke of said key at key operation.

2. A keyboard apparatus as claimed in claim 1 in which said coil pattern is constructed and arranged such that a gap exists between said coil pattern and said inducing means and wherein the size of said gap corresponds to the key stroke of said key at key operation.

3. A keyboard apparatus as claimed in claim 1 or 2 in which said means for inducing includes a metallic first body having a plurality of angled first faces extending parallel to the direction of said key operation, and wherein said coil pattern is formed on a face of a second body having a plurality of angled second faces extending parallel to said first faces of said first body.

4. A keyboard apparatus as claimed in claim 1 or 2 in which said means for inducing includes a metallic first body having a plurality of angled first faces extending parallel to the direction of said key operation, and wherein two or more of said coil patterns are formed on faces of a second body having a plurality of angled second faces extending parallel to said first faces on said first body.

5. A keyboard apparatus as claimed in claim 4 in which said two or more coil patterns are formed independently of each other and disposed on different ones of said second faces.

6. A keyboard apparatus as claimed in claim 4 in which at least one of said two or more coil patterns is formed extending over two adjacent ones of said second faces.

7. A keyboard apparatus as claimed in claim 1 or 2 in which said means for inducing includes a metallic first body having a plurality of angled first faces extending parallel and normal to the direction of said key operation and wherein two or more of said coil patterns are formed on faces of a second body having second faces extending in parallel to said first faces on said first body.

8. A musical tone control parameter controller for a musical instrument, comprising:

a mobile unit which moves on manual operation by a player;

oscillating means for oscillating a wave whose frequency changes in accordance with movement of said mobile unit, frequency detecting means for detecting said frequency of said wave for measurement of the extent of said movement of said mobile unit;

speed detecting means for detecting a speed of said movement of said mobile unit on the basis of at least two frequencies detected at different times by said frequency detecting means; and parameter controlling means for controlling a musical tone control parameter on the basis of a frequency detected by said frequency detecting means when said speed of said movement of said mobile unit exceeds a prescribed value.

9. A controller as set out in claim 8, wherein said mobile unit is a key on a keyboard of said musical instrument.

10. A controller as set out in claim 8 further comprising dividing means for dividing said extent of said movement into a plurality of regions so that said parameter controlling means should perform control of different musical tone control parameters in different regions.

11. A controller as claimed in claim 8 wherein said frequency detecting means includes initiation detecting means for detecting initiation of said manual operation on said mobile unit when said frequency exceeds a prescribed value, and said parameter controlling means performs said control of said musical tone control parameters after said initiation of said manual operation is detected.

12. A controller as set out in claim 8 wherein said frequency detecting means includes termination detection means for detecting termination of said manual operation on said mobile unit when said frequency exceeds another prescribed value, and said parameter controlling means performs said control of said musical tone control parameters after said termination of said manual operation is detected.

13. A musical tone control parameter controller for a musical instrument comprising:

a mobile unit which moves on manual operation by a player;

oscillating means for oscillating a wave whose frequency changes in accordance with movement of said mobile unit, said oscillating means including a coil pattern and a magnetic material which are arranged in a face-to-face relationship and which changes the mating surface area of the coil pattern with respect to the magnetic material in accordance with the extent of movement of said mobile unit.

14. A controller as set out in claim 22, wherein said mobile unit is a key in a keyboard of said musical instrument.

* * * * *